United States Patent
Takeuchi et al.

(10) Patent No.: US 6,657,364 B1
(45) Date of Patent: Dec. 2, 2003

(54) PIEZOELECTRIC/ELECTROSTRICTIVE DEVICE

(75) Inventors: Yukihisa Takeuchi, Aichi-Prefecture (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/677,304

(22) Filed: Sep. 29, 2000

(30) Foreign Application Priority Data

Oct. 1, 1999 (JP) .......................... 11-281522
Mar. 1, 2000 (JP) ........................ 2000-056434

(51) Int. Cl.[7] .............................. H01L 41/08
(52) U.S. Cl. ............... 310/328; 310/324; 310/323.01; 310/323.17; 310/368; 310/330
(58) Field of Search ........................ 310/324, 328, 310/323.01, 323.017, 368, 330

(56) References Cited

U.S. PATENT DOCUMENTS

| | | | | |
|---|---|---|---|---|
| 4,485,325 A | * | 11/1984 | Yamamoto et al. | 310/344 |
| 4,523,120 A | * | 6/1985 | Assard et al. | 310/323 |
| 4,612,440 A | | 9/1986 | Brunnee et al. | 250/281 |
| 4,700,177 A | * | 10/1987 | Nakashima et al. | 340/388 |
| 4,805,057 A | | 2/1989 | Ogawa et al. | 360/109 |
| 4,998,879 A | | 3/1991 | Foster et al. | |
| 5,049,775 A | * | 9/1991 | Smits | 310/328 |
| 5,063,321 A | * | 11/1991 | Carter | 310/323 |
| 5,481,152 A | * | 1/1996 | Buschulte | 310/328 |
| 5,685,701 A | | 11/1997 | Chandler et al. | |
| 5,691,594 A | | 11/1997 | Takeuchi et al. | 310/330 |
| 5,693,997 A | * | 12/1997 | Griffith et al. | 310/328 |
| 5,736,808 A | * | 4/1998 | Szilagyi et al. | 310/322 |
| 5,745,319 A | | 4/1998 | Takekado et al. | 360/78.05 |

(List continued on next page.)

FOREIGN PATENT DOCUMENTS

| | | | | |
|---|---|---|---|---|
| EP | 1 017 116 A2 | 7/2000 | .......... | H01L/41/09 |
| EP | 1 089 351 A2 | 4/2001 | .......... | H01L/41/08 |
| EP | 1 089 352 A2 | 4/2001 | .......... | H01L/41/08 |
| EP | 1 089 356 A2 | 4/2001 | .......... | H01L/41/09 |
| EP | 1 089 358 A2 | 4/2001 | .......... | H01L/41/09 |
| JP | 61-183981 | 8/1986 | .......... | H01L/41/08 |
| JP | 62-168535 | 10/1987 | .......... | H01H/57/00 |
| JP | 63-64640 | 3/1988 | .......... | G11B/7/09 |
| JP | 1-107997 | 7/1989 | .......... | G12B/5/00 |
| JP | 2-159982 | 6/1990 | .......... | H02N/2/00 |
| JP | 10-136665 | 5/1998 | .......... | H02N/2/00 |
| JP | 11-51959 | * 2/1999 | .......... | 310/328 |
| JP | 2-119278 | * 5/1999 | .......... | 310/328 |
| WO | 01/26166 A1 | 4/2001 | .......... | H01L/41/08 |
| WO | 01/26169 A1 | 4/2001 | .......... | H01L/41/08 |

OTHER PUBLICATIONS

Yoshikazu Soeno, et al., "Piezoelectric Piggy–Back Microactuator for Hard Disk Drive," IEEE Transactions on Magnetics, vol. 35, No. 2, Mar. 1999, pp 983–987.

S. Koganezawa, et al., "Dual–Stage Actuator System for Magnetic Disk Drives Using a Shear Mode Piezoelectric Microactuator," IEEE Transactions on Magnetics, vol. 35, No. 2, Mar. 1999, pp 998–992.

(List continued on next page.)

Primary Examiner—Thomas M. Dougherty
(74) Attorney, Agent, or Firm—Burr & Brown

(57) ABSTRACT

A piezoelectric/electrostrictive device includes a pair of mutually opposing thin plate sections made of metal and a fixation section for supporting the thin plate sections. One or more piezoelectric/electrostrictive elements are arranged on at least one thin plate section of the pair of thin plate sections. An object is attached to forward end portions of the pair of thin plate sections. An areal size of a surface of the object interposed between the thin plate sections is larger than an areal size of an object attachment surface of the thin plate sections.

6 Claims, 12 Drawing Sheets

U.S. PATENT DOCUMENTS

| | | | | |
|---|---|---|---|---|
| 5,747,915 | A | * 5/1998 | Benavides | 310/331 |
| 5,828,157 | A | * 10/1998 | Miki et al. | 310/828 |
| 5,876,659 | A | 3/1999 | Yasutomi et al. | |
| 5,912,524 | A | 6/1999 | Ohnishi et al. | 310/321 |
| 5,969,248 | A | 10/1999 | Kurachi et al. | 73/504.12 |
| 6,049,158 | A | 4/2000 | Takeuchi et al. | 310/328 |
| 6,064,746 | A | * 5/2000 | Nakamura et al. | 310/324 |
| 6,072,665 | A | * 6/2000 | Ferrari et al. | 360/104 |
| 6,091,182 | A | * 7/2000 | Takeuchi et al. | 310/330 |
| 6,109,104 | A | 8/2000 | Fukuda et al. | 73/504.13 |
| 6,140,739 | A | 10/2000 | Arai et al. | 310/321 |
| 6,162,544 | A | 12/2000 | Hanzawa | |
| 6,246,552 | B1 | 6/2001 | Soeno et al. | 360/294.4 |
| 6,262,516 | B1 | 7/2001 | Fukuda et al. | 310/328 |
| 6,267,146 | B1 | * 7/2001 | Miyazoe et al. | 137/883 |

OTHER PUBLICATIONS

U.S. patent application Ser. No. 10/046,331, Ikeda et al., filed Jan. 14, 2002.

U.S. patent application Ser. No. 09/671,669, Takeuchi et al., filed Sep. 27, 2000.

U.S. patent application Ser. No. 09/661,881, Takeuchi et al., filed Sep. 14, 2000.

U.S. patent application Ser. No. 09/676,209, Takeuchi et al., filed Sep. 29, 2000.

U.S. patent application Ser. No. 09/878,773, Ikeda et al., filed Jun. 11, 2001.

U.S. patent application Ser. No. 10/281,373, Takeuchi et al., filed Oct. 25, 2002.

U.S. patent application Ser. No. 09/642,861, Takeuchi et al., filed Aug. 21, 2000.

U.S. patent application Ser. No. 09/643,163, Takeuchi et al., filed Aug. 21, 2000.

U.S. patent application Ser. No. 09/177,730, Hanzawa, filed Oct. 23, 1998.

U.S. patent application Ser. No. 09/211,085, Hanzawa, filed Dec. 14, 1998.

U.S. patent application Ser. No. 09/802,581, Hanzawa, et al., filed Mar. 8, 2001.

U.S. patent application Ser. No. 09/308,281, Hanzawa, et al., filed Jun. 30, 1999.

U.S. patent application Ser. No. 09/499,994, Hanzawa, et al., filed Feb. 4, 2000.

U.S. patent application Ser. No. 09/543,876, Hanzawa, et al., filed Jan. 6, 2000.

U.S. patent application Ser. No. 09/114,760 Hanzawa, et al., filed Jul. 13, 1998.

* cited by examiner

PIEZOELECTRIC/ELECTROSTRICTIVE DEVICE

BACKGROUND OF THE INVENTION

1. Field of the Invention

The present invention relates to a piezoelectric/electrostrictive device which is provided with a movable section to be operated on the basis of a displacement action of a piezoelectric/electrostrictive element.

2. Description of the Related Art

Recently, a displacement element, which makes it possible to adjust the optical path length and the position in an order of submicron, is required, for example, in the fields of the optics; magnetic recording, and precision machining. Development is advanced for the displacement element based on the use of the displacement brought about by the inverse piezoelectric effect or the electrostrictive effect caused when a voltage is applied to a piezoelectric/electrostrictive material (for example, a ferroelectric material).

As shown in FIG. 12, for example, those hitherto disclosed as such a displacement element include a piezoelectric actuator comprising a fixation section 204, a movable section 206, and a beam section 208 for supporting them which are formed in an integrated manner with a hole 202 provided through a plate-shaped member 200 composed of a piezoelectric/electrostrictive material and with an electrode layer 210 provided on the beam section 208 (see, for example, Japanese Laid-Open Patent Publication No. 10-136665).

The piezoelectric actuator is operated such that when a voltage is applied to the electrode layer 210, the beam section 208 makes expansion and contraction in a direction along a line obtained by connecting the fixation section 204 and the movable section 206 in accordance with the inverse piezoelectric effect or the electrostrictive effect. Therefore, the movable section 206 can perform circular arc-shaped displacement or rotational displacement in the plane of the plate-shaped member 200.

On the other hand, Japanese Laid-Open Patent Publication No. 63-64640 discloses a technique in relation to an actuator based on the use of a bimorph. In this technique, electrodes for the bimorph are provided in a divided manner The actuator is driven due to the selection of the divided electrodes, and thus highly accurate positioning is performed at a high speed. This patent document (especially in FIG. 4) discloses a structure in which, for example, two bimorphs are used in an opposed manner.

However, the piezoelectric actuator described above involves such a problem that the amount of operation of the movable section 206 is small, because the displacement in the direction of expansion and contraction of the piezoelectric/electrostrictive material (i.e., in the in-plane direction of the plate-shaped member 200) is transmitted to the movable section 206 as it is.

All of the parts of the piezoelectric actuator are made of the piezoelectric/electrostrictive material which is a fragile material having a relatively heavy weight. Therefore, the following problems arise. That is, the mechanical strength is low, and the piezoelectric actuator is inferior in handling performance, shock resistance, and moisture resistance. Further, the piezoelectric actuator itself is heavy, and its operation tends to be affected by harmful vibrations (for example, residual vibration and noise vibration during high speed operation).

In order to solve the problems described above, it has been suggested that the hole 202 is filled with a filler material having flexibility. However, in this case, it is clear that the amount of displacement, which is brought about by the inverse piezoelectric effect or the electrostrictive effect, is decreased.

SUMMARY OF THE INVENTION

The present invention has been made taking the foregoing problems into consideration, an object of which is to provide a piezoelectric/electrostrictive device which makes it possible to realize a long service life of the device and miniaturize the device and which is scarcely affected by harmful vibration and capable of high speed response with high mechanical strength while being excellent in handling performance, shock resistance, and moisture resistance.

According to the present invention, there is provided a piezoelectric/electrostrictive device comprising a pair of mutually opposing thin plate sections made of metal and a fixation section for supporting the thin plate sections; an object attached to forward end portions of the pair of thin plate sections; and one or more piezoelectric/electrostrictive elements arranged on at least one thin plate section of the pair of thin plate sections; wherein an areal size of a surface of the object opposed to the thin plate section is larger than an areal size of an object attachment surface of the thin plate section.

Accordingly, it is possible to displace the pair of thin plate sections to a great extent, and it is possible to realize a high speed of the device, especially of the pair of thin plate sections (realize a high resonance frequency). Further, it is possible to obtain a displacement element which is scarcely affected by any harmful vibration, which is capable of high speed response, which has a high mechanical strength, and which is excellent in handling performance, shock resistance, and humidity resistance. Furthermore, it is possible to obtain a sensor element which makes it possible to accurately detect the vibration of the movable section.

Especially, in the present invention, the device is excellent in strength and toughness, and the device is capable of responding to any quick displacement action, because the thin plate section Is made of metal. Therefore, according to the present invention, it is possible to sufficiently respond to any variation of the environment of use and any severe state of use. It is possible to realize a long service life of die piezoelectric/electrostrictive device, and it is possible to contemplate the handling performance of the piezoelectric/electrostrictive device. Further, the thin plate section can be greatly displaced at a relatively low voltage, and it is possible to achieve the realization of a high speed of the displacement action of the thin plate section (realize a high resonance frequency).

In the device constructed as described above, it is also preferable that a first adhesive is allowed to intervene between the piezoelectric/electrostrictive element and the thin plate section. It is also preferable that the object is secured to the object attachment surface of the thin plate section by the aid of a second adhesive.

In the arrangements as described above, the first adhesive and/or the second adhesive may be composed of organic resin, or the first adhesive and/or the second adhesive may be composed of glass, brazing material, or solder.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Explanation will be made below with reference to FIGS. 1 to 11 for illustrative embodiments of the piezoelectric/electrostrictive device according to the present invention.

Figure 1:
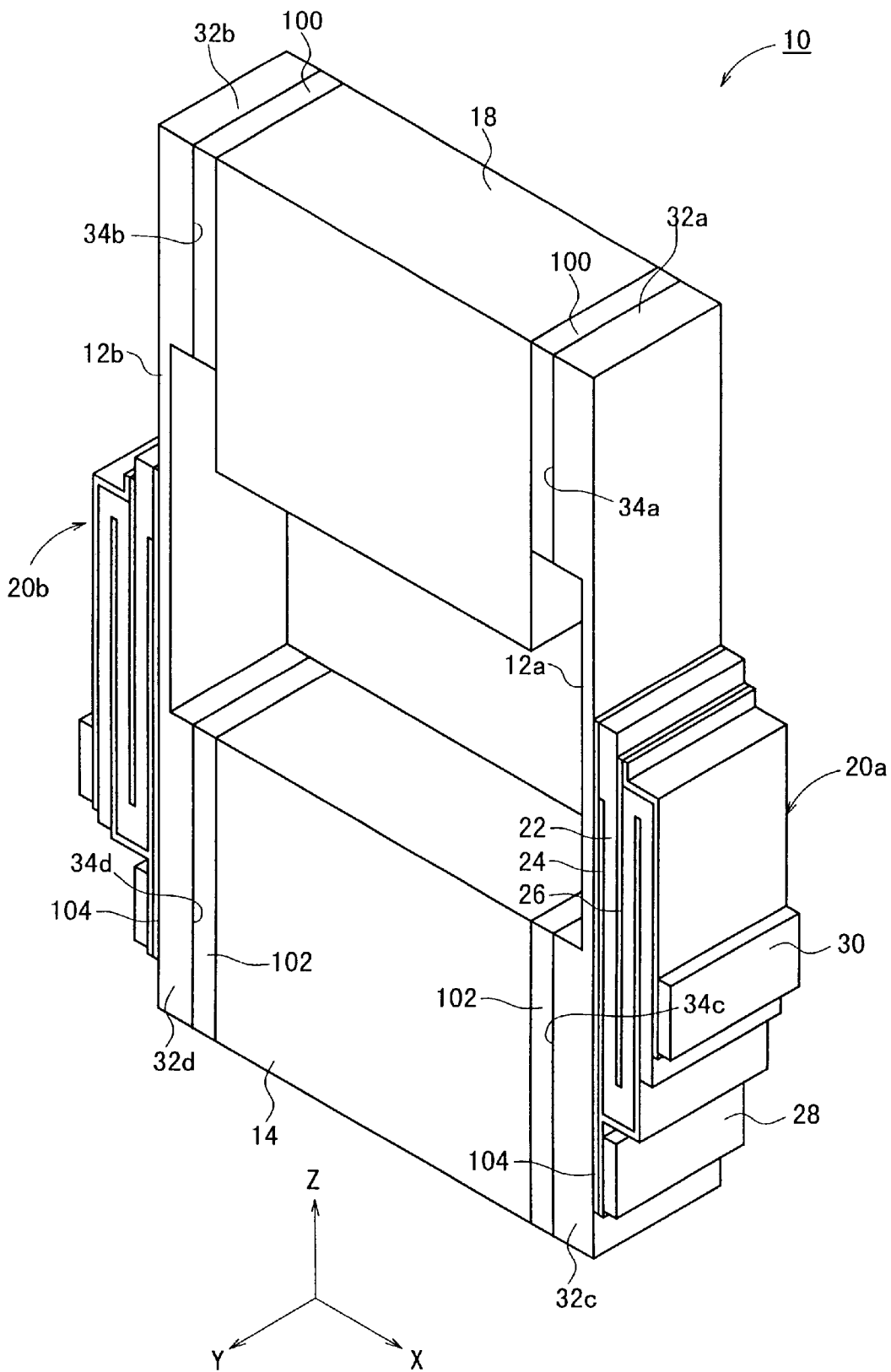
FIG. 1 shows a perspective view illustrating an arrangement of a piezoelectric/electrostrictive device according to an embodiment of the present invention.

As shown in FIG. 1, the piezoelectric/electrostrictive device 10 according to this embodiment comprises a pair of mutually opposing thin plate sections 12a, 12b made of metal, a fixation section 14 for supporting the thin plate sections 12a, 12b, and an object 18 allowed to intervene between forward end portions of the pair of thin plate sections 12a, 12b. The piezoelectric/electrostrictive device 10 further comprises piezoelectric/electrostrictive elements 20a, 20b which are arranged on outer surfaces (hereinafter referred to as "side surfaces") of the pair of thin plate sections 12a, 12b respectively. The piezoelectric/electrostrictive device 10 is operated such that the object is displaced in accordance with the driving of the piezoelectric/electrostrictive element or elements 20a and/or 20b.

The object 18 is bonded by the aid of an adhesive 100 between the forward end portions of the respective thin plate sections 12a, 12b. The fixation section 14 is bonded by the aid of an adhesive 102 between rearward end portions of the respective thin plate sections 12a, 12b.

The piezoelectric/electrostrictive elements 20a, 20b are prepared as separate members, and the prepared piezoelectric/electrostrictive elements 20a, 20b are secured to the side surfaces of the thin plate sections 12a, 12b respectively with the adhesive 104. Those usable as the adhesives 100, 102, 104 include, for example, organic resin, glass, brazing material, and soldering glass.

The piezoelectric/electrostrictive element 20a, 20b comprises a piezoelectric/electrostrictive layer 22, and a pair of electrodes 24, 26 which are formed on both sides of the piezoelectric/electrostrictive layer 22. The first electrode 24 of the pair of electrodes 24, 26 is formed at least on each of the pair of thin plate sections 12a, 12b.

In the embodiment of the present invention, each of the piezoelectric/electrostrictive layer 22 and the pair of electrodes 24, 26 has a multilayered structure, and the first electrode 24 and the second electrode 26 are alternately stacked with each other to give a substantially comb-shaped cross section to provide the piezoelectric/electrostrictive element 12a, 12b which has a multiple stage structure at a portion at which the first electrode 24 and the second electrode 26 are overlapped with each other with the piezoelectric/electrostrictive layer 22 interposed therebetween.

FIG. 1 is illustrative of a case in which the piezoelectric/electrostrictive layer 22 has a three-layered structure, the first electrode 24 is formed to have a comb-shaped configuration to be located at the lower surface of the first layer (side surface of the thin plate section 12a, 12b) and at the upper surface of the second layer, and the second electrode 26 is formed to have a comb-shaped configuration to be located at the upper surface of the first layer and at the upper surface of the third layer. In the case of this arrangement, the number of terminals 28, 30 can be decreased by mutually connecting the first electrodes 24 and the second electrodes 26 respectively to be common. Therefore, the increase in size, which would be otherwise caused by the multilayered structure of the piezoelectric/electrostrictive element 20a, 20b, can be suppressed.

The respective forward end portions and the respective rearward end portions of the pair of thin plate sections 12a, 12b are thick-walled toward the inside. Mutually opposing surfaces 34a, 34b, 34c, 34d of the respective thick-walled sections 32a, 32b, 33c, 32d function as object attachment surfaces for attaching the object 18.

On the other hand, the object 18 has a size of such a degree that it is accommodated between the respective thick-walled sections 32a, 32b of the pair of thin plate sections 12a, 12b, and it has a substantially rectangular parallelepiped-shaped configuration (of course, there is no limitation to the rectangular parallelepiped). The areal size of the side surface of the object 18 (surface opposed to the thick-walled section 32a, 32b of the thin plate section 12a, 12b) is designed to be larger than the areal size of the object attachment surface 34a, 34b of the thin plate section 12a, 12b.

In FIG. 1, the following positional relationship is given. That is, the forward end surface of the object 18 and the forward end surface of each of the thin plate sections 12a, 12b are substantially in the same plane surface. The rearward end surface (surface opposed to the fixation section 14)

of the object 18 protrudes toward the fixation section 14 with respect to the thick-walled sections 32a, 32b of the thin plate sections 12a, 12b. The object 18 is secured to the object attachment surfaces 34a, 34b of the thin plate sections 12a, 12b by the aid of the adhesive 100 as described above.

In the piezoelectric/electrostrictive device 10 according to the embodiment described above, as shown in FIG. 4, for example, it is preferable that distances La, Lb from the central axis n of the object 18 to the respective object attachment surfaces 34a, 34b are approximately identical to one another.

The voltage is applied to the pair of electrodes 24, 26 via terminals (pads) 28, 30 of the respective electrodes 24, 26 formed on both side surfaces (element formation surfaces) of the fixation section 14 respectively. The respective terminals 28, 30 are positioned as follows. That is, the terminal 28 corresponding to the first electrode 24 is formed at the position deviated toward the rearward end of the fixation section 14. The terminal 30 corresponding to the second electrode 26 disposed on the side of the external space is formed at the position deviated toward the inner wall of the fixation section 14.

In this embodiment, the piezoelectric/electrostrictive device 10 can be individually fixed by utilizing the surfaces respectively different from the surfaces on which the terminals 28, 30 are arranged. As a result, it is possible to obtain high reliability for both of the fixation of the piezoelectric/electrostrictive device 10 and the electric connection between the circuit and the terminals 28, 30. In this arrangement, the electric connection between the terminals 28, 30 and the circuit is made, for example, by means of the flexible printed circuit (also referred to as FPC), the flexible flat cable (also referred to as FFC), and wire bonding.

Figure 2:
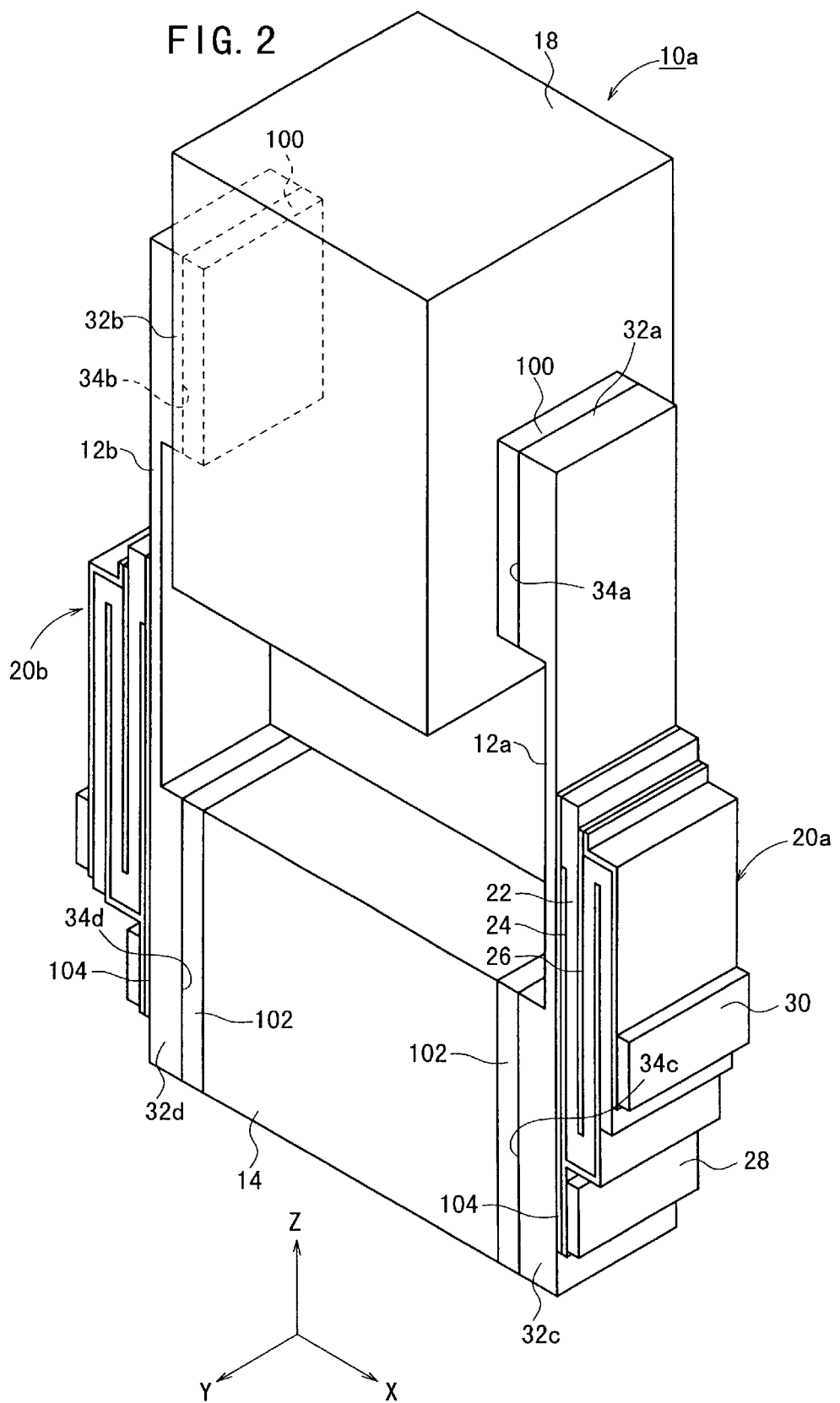
FIG. 2 shows a perspective view illustrating a first modified embodiment of the piezoelectric/electrostrictive device according to the embodiment of the present invention.

Arrangements other than the arrangement shown in FIG. 1 are available to construct the piezoelectric/electrostrictive device 10 according to the embodiment of the present invention. That is, as in a piezoelectric/electrostrictive device 10a according to a first modified embodiment shown in FIG. 2, the size of the object 18 may be further increased. The embodiment shown in FIG. 2 is illustrative of a case in which the size of the side surface of the object 18 is made larger than the size of the object attachment surface 34a, 34b in the vertical direction and in the lateral direction.

Figure 3:
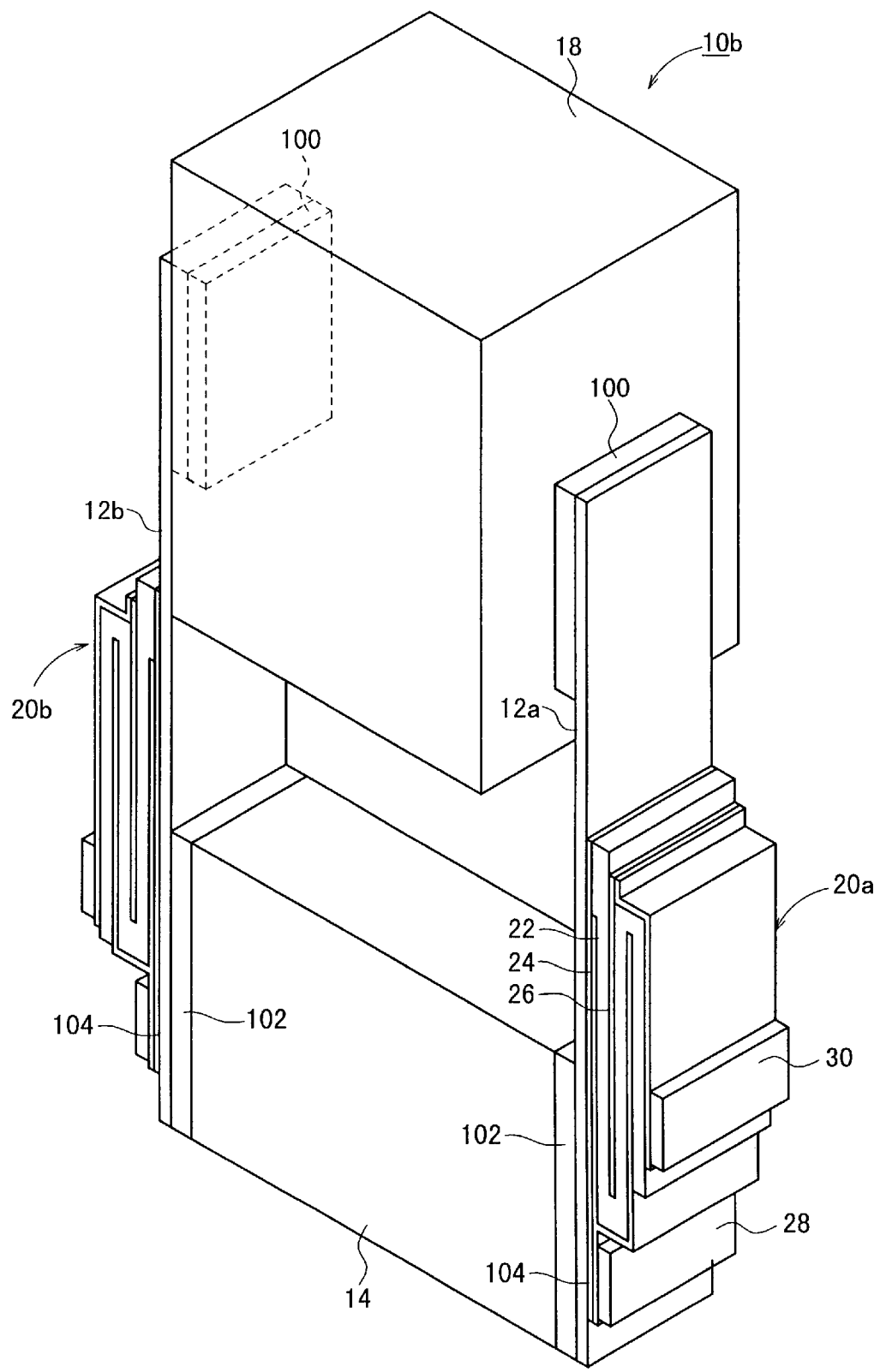
FIG. 3 shows a perspective view illustrating a second modified embodiment of the piezoelectric/electrostrictive device according to the embodiment of the present invention.

Further, as in a piezoelectric/electrostrictive device 10b according to a second modified embodiment shown in FIG. 3, the whole of the thin plate section 12a, 12b may have an identical thickness, without providing the thick-walled section 32a, 32b at the forward end portion of the thin plate section 12a, 12b. In this case, it is possible to attach the object 18 having a larger size.

In the embodiment of the present invention, the piezoelectric/electrostrictive element 20a, 20b is allowed to have the multiple stage structure. Therefore, the generated force of the piezoelectric/electrostrictive element 20a, 20b is increased, and thus it is possible to contemplate the large displacement. Further, the rigidity of the piezoelectric/electrostrictive device 10 itself is increased, and thus it is possible to realize the high resonance frequency, making it easy to achieve the realization of a high speed of the displacement action.

When the number of stages is increased, it is possible to increase the driving force. However, the electric power consumption is also increased in accordance therewith. Therefore, when the device is practically produced and used, for example, it is preferable that the number of stages is appropriately determined depending on the way of use and the state of use. In the case of the piezoelectric/electrostrictive device 10 according to this embodiment, even when the driving force is increased by providing the multistage structure of the piezoelectric/electrostrictive element 20a, 20b, the width of the thin plate section 12a, 12b (distance in the Y axis direction) is basically unchanged. Therefore, the device is extremely preferred to make application, for example, to the actuator for the purpose of the ringing control and the positioning of the magnetic head for the hard disk to be used in an extremely narrow gap.

Figure 4:
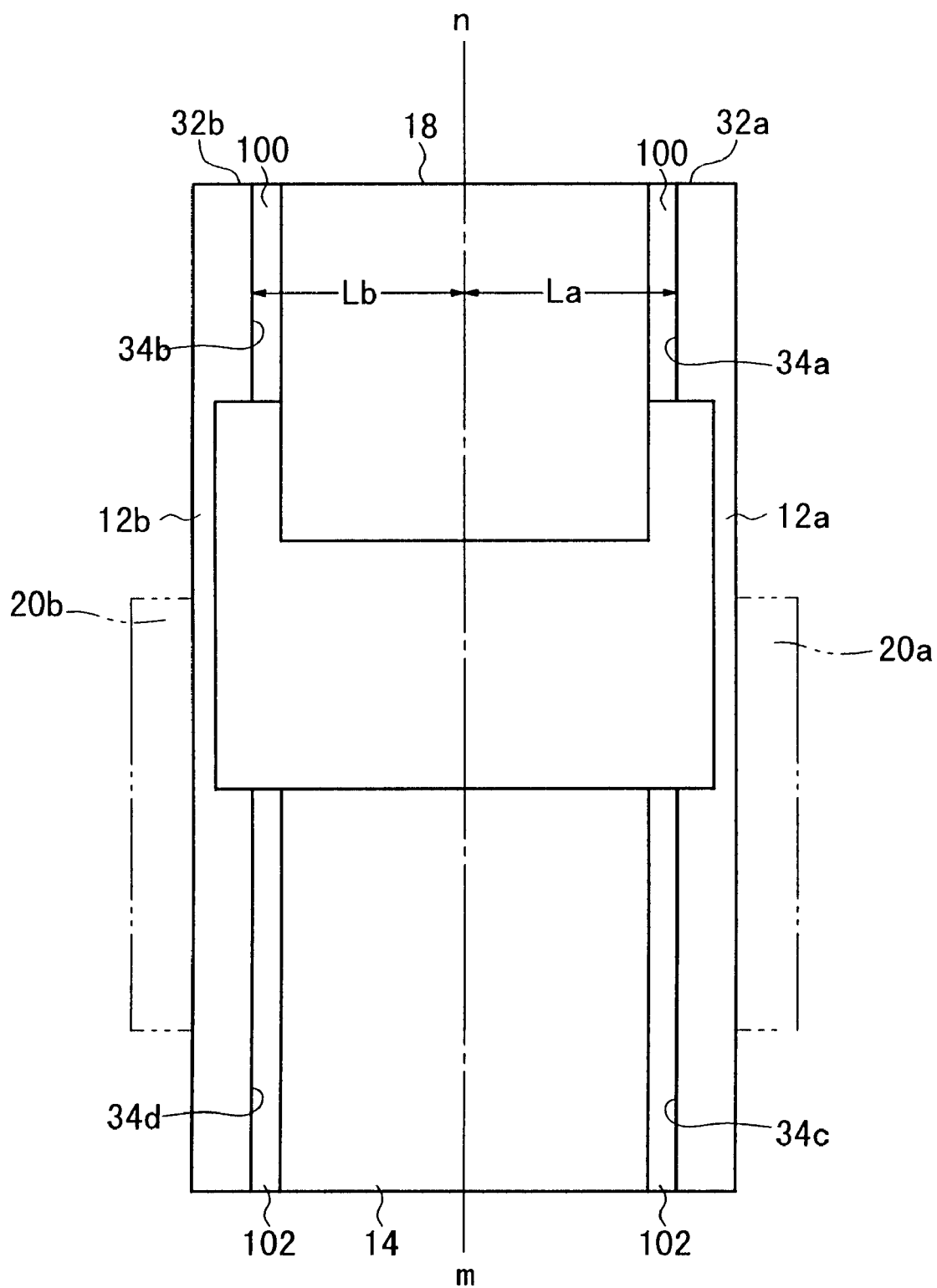
FIG. 4 illustrates a situation in which both of piezoelectric/electrostrictive elements do not make the displacement action in the piezoelectric/electrostrictive device according to the embodiment of the present invention.

The operation of the piezoelectric/electrostrictive device 10 according to this embodiment will now be explained. At first, for example, when the two piezoelectric/electrostrictive elements 20a, 20b are in the natural state, namely when both of the piezoelectric/electrostrictive elements 20a, 20b do not make the displacement action, then the major axis m of the piezoelectric/electrostrictive device 10 (central axis of the fixation section) is substantially alinged with the central axis n of the object 18 as shown in FIG. 4.

Figure 5A:
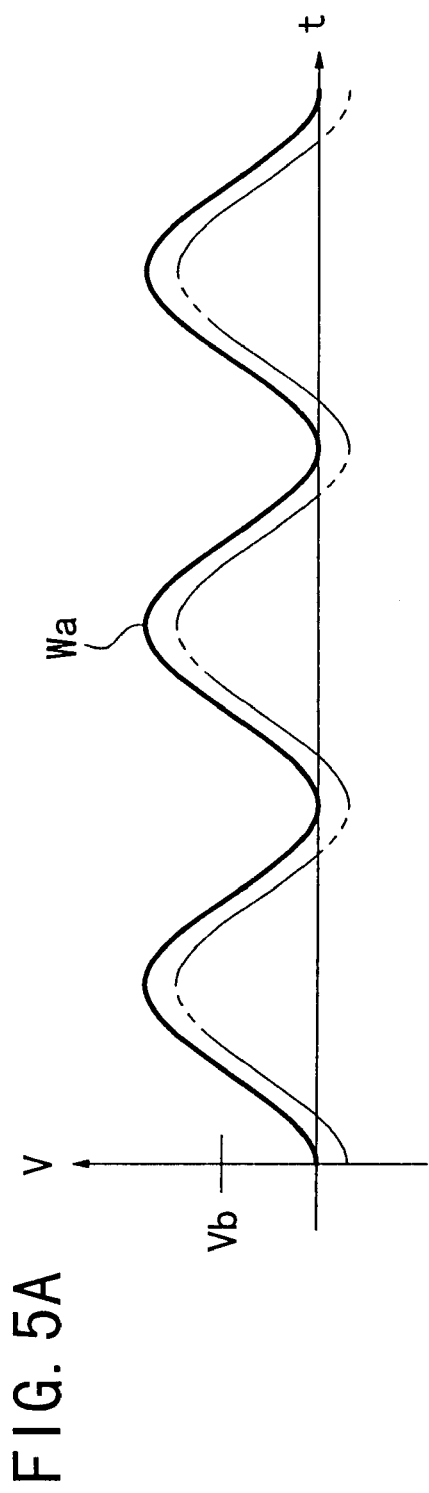
FIG. 5A shows a waveform illustrating a voltage waveform to be applied to the first piezoelectric/electrostrictive element.
Figure 5B:
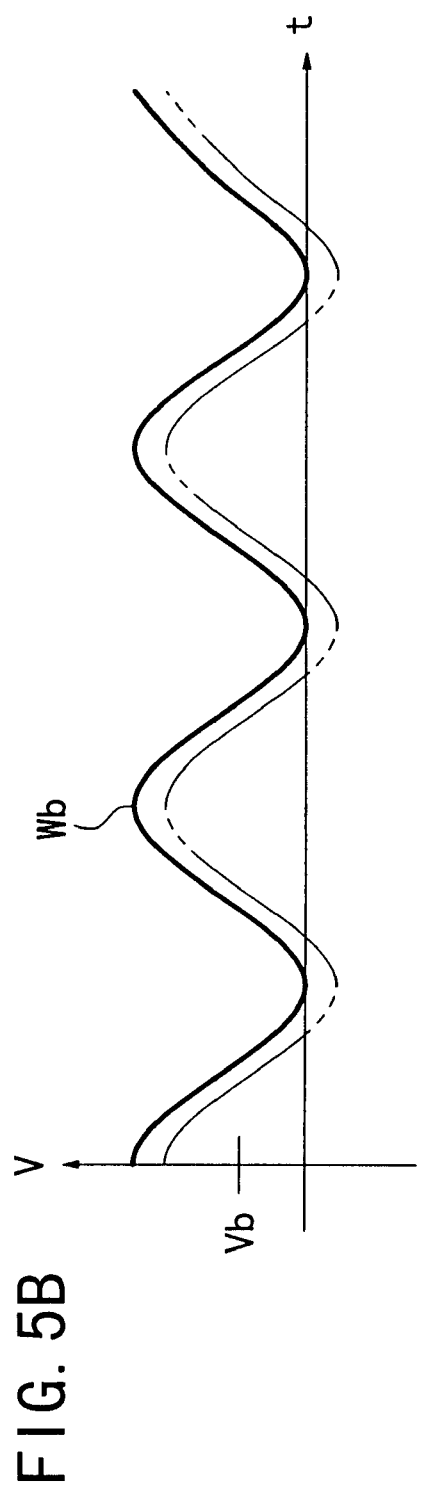
FIG. 5B shows a waveform illustrating a voltage waveform to be applied to the second piezoelectric/electrostrictive element.

Starting from this state, for example, a sine wave Wa, which has a predetermined bias electric potential Vb, is applied to the pair of electrodes 24, 26 of the first piezoelectric/electrostrictive element 20a as shown in a waveform figure shown in FIG. 5A, while a sine wave Wb, which has a phase different from that of the sine wave Wa by about 180°, is applied to the pair of electrodes 24, 26 of the second piezoelectric/electrostrictive element 20b as shown in FIG. 5B.

Figure 6:
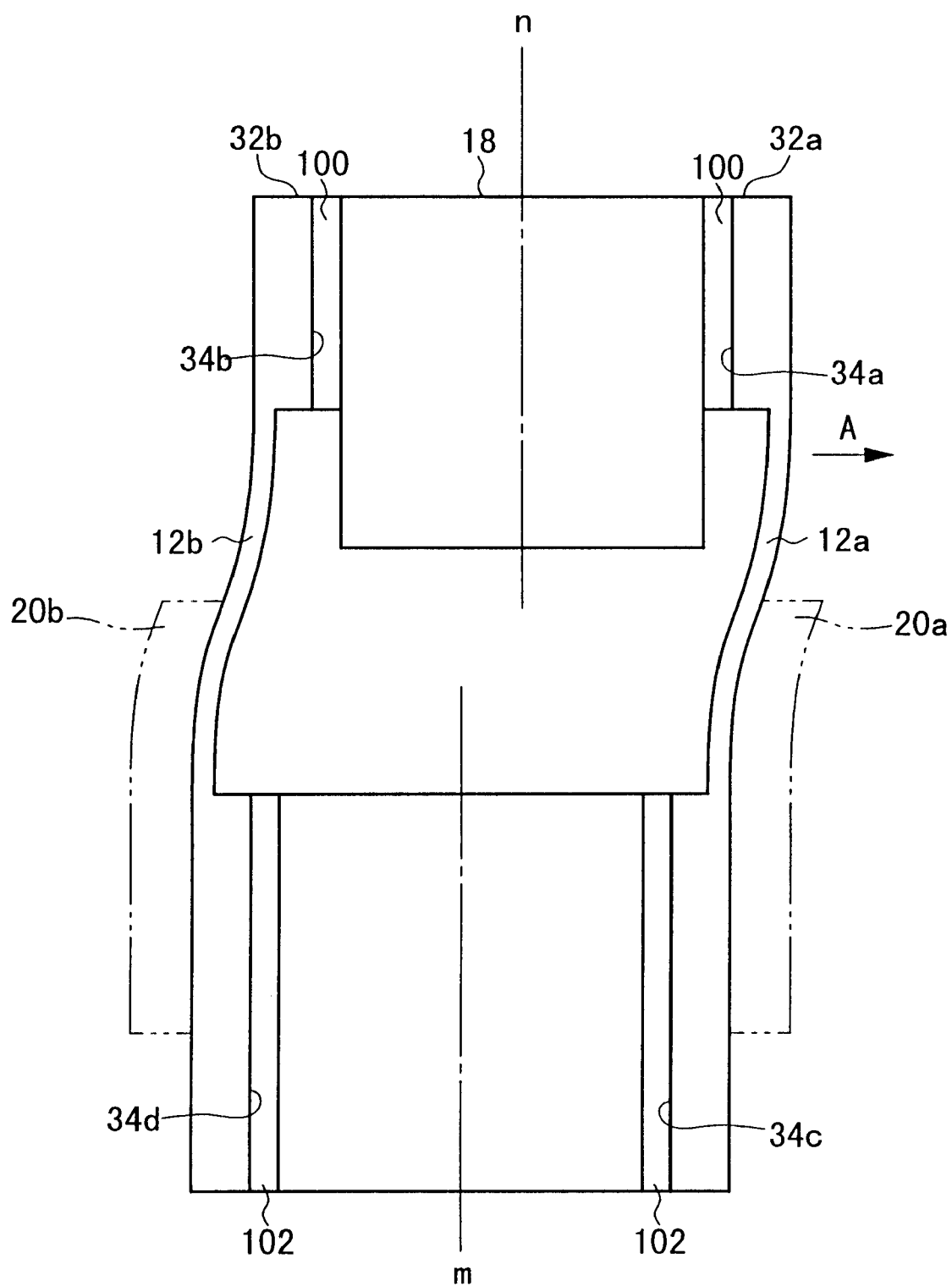
FIG. 6 illustrates a situation in which the piezoelectric/electrostrictive element makes the displacement action in the piezoelectric/electrostrictive device according to the embodiment of the present invention.

The piezoelectric/electrostrictive layer 22 of the first piezoelectric/electrostrictive element 20a makes the contraction displacement in the direction of the first principal surface at a stage at which, for example, a voltage having a maximum value is applied to the pair of electrodes 24, 26 of the first piezoelectric/electrostrictive element 20a. Accordingly, as shown in FIG. 6, for example, the stress is generated for the first thin plate section 12a to bend the thin plate section 12a, for example, in the rightward direction as shown by the arrow A. Therefore, the first thin plate section 12a is bent in the rightward direction. At this time, a state is given, in which no voltage is applied to the pair of electrodes 24, 26 of the second piezoelectric/electrostrictive element 20b. Therefore, the second thin plate section 12b follows the bending of the first thin plate section 12a, and it is bent in the rightward direction. As a result, the object 18 is displaced, for example, in the rightward direction with respect to the major axis m of the piezoelectric/electrostrictive device 10. The displacement amount is changed depending on the maximum value of the voltage applied to each of the piezoelectric/electrostrictive elements 20a, 20b. For example, the larger the maximum value is, the larger the displacement amount is.

Especially, when a piezoelectric/electrostrictive material having a high coercive electric field is applied as the constitutive material for the piezoelectric/electrostrictive layer 22, the bias electric potential may be adjusted so that the level of the minimum value is a slightly negative level as depicted by waveforms indicated by dashed lines in FIGS. 5A and 5B. In this case, for example, the stress, which is in the same direction as the bending direction of the first thin plate section 12a, is generated in the second thin plate section 12b by driving the piezoelectric/electrostrictive element (for example, the second piezoelectric/electrostrictive element 20b) to which the negative level is applied. Accordingly, it is possible to further increase the displacement amount of the object 18. In other words, when the waveforms indicated by the dashed lines in FIGS. 5A and 5B are used, the device is allowed to have such a function that the piezoelectric/electrostrictive element 20b or 20a, to which the negative level is applied, supports the piezoelectric/electrostrictive element 20a or 20b which principally makes the displacement action.

As described above, in the piezoelectric/electrostrictive device 10 according to the embodiment of the present invention, the minute displacement of the piezoelectric/electrostrictive element 20a, 20b is amplified into the large displacement action by utilizing the bending of the thin plate section 12a, 12b, and it is transmitted to the object 18. Accordingly, it is possible to greatly displace the object 18 with respect to the major axis m of the piezoelectric/electrostrictive device 10.

Especially, in this embodiment, the object 18 is attached in such a form that the object 18 is interposed between the pair of thin plate sections 12a, 12b. Therefore, it is possible to effectively suppress the increase in size, especially the increase in size in the Y axis direction, which would be otherwise caused when the object 18 is attached.

Further, this embodiment is constructed such that the stacked type piezoelectric/electrostrictive element 20a, 20b is secured onto each of the thin plate sections 12a, 12b made of metal by the aid of the adhesive 104. Therefore, the thin plate section 12a (and 12b) can be greatly displaced even when the areal size of the piezoelectric/electrostrictive element 20a, 20b as viewed in plan view is not widened. Further, the device is excellent in strength and toughness, and it can respond to any quick displacement action, because the the thin plate section 12a (and 12b) is made of metal.

That is, in this embodiment, it is possible to sufficiently respond to any variation of the environment of the use and any severe state of the use. It is possible to realize a long service life of the piezoelectric/electrostrictive device 10, and it is possible to contemplate the handling performance of the piezoelectric/electrostrictive device 10. Further, the thin plate section 12a (and 12b) can be greatly displaced at a relatively low voltage. It is possible to achieve the realization of a high speed of the displacement action of the thin plate section 12a (and 12b) (realize a high resonance frequency).

Further, in this embodiment, it is unnecessary to constitute all of the parts with the piezoelectric/electrostrictive material which is a fragile material having a relatively heavy weight. Therefore, the following advantages are obtained. That is, the device has a high mechanical strength, and it is excellent in handling performance, shock resistance, and moisture resistance. Further, the operation of the device is scarcely affected by harmful vibration (for example, residual vibration and noise vibration during high speed operation).

In this embodiment, the piezoelectric/electrostrictive element 20a, 20b is constructed to have the piezoelectric/electrostrictive layer 22 and the pair of electrodes 24, 26 which are formed on both sides of the piezoelectric/electrostrictive layer 22. The first electrode 24 of the pair of electrodes 24, 26 is formed directly on at least the side surface of the thin plate section 12a, 12b by the aid of the adhesive 104. Accordingly, the vibration, which is caused by the piezoelectric/electrostrictive element 20a, 20b, can be efficiently transmitted to the object 18 via the thin plate section 12a, 12b. Thus, it is possible to improve the response performance. Therefore, it is desirable that the adhesive 104 scarcely inhibits the vibration of the piezoelectric/electrostrictive element 20a, 20b.

In this embodiment, the portion (substantial driving portion), at which the pair of electrodes 24, 26 are over-lapped with each other with the piezoelectric/electrostrictive layer 22 interposed therebetween, is formed continuously to be included in a region ranging from a part of the fixation section 14 to a part of the thin plate section 12a, 12b. Therefore, it is possible to avoid the inconvenience of the restriction of the displacement action of the object 18. It is possible to increase the displacement amount of the object 18.

The actual size of each of the components is determined considering, for example, the areal size of the object attachment surface 34a, 34b of the thin plate section 12a, 12b, the joining area for attaching the fixation section 14 to another member, the joining area for attaching the electrode terminal or the like, and the strength of the entire piezoelectric/electrostrictive device 10, the durability, the necessary displacement amount, the resonance frequency, and the driving voltage.

In the piezoelectric/electrostrictive device 10, the shape of the piezoelectric/electrostrictive device 10 is unlike the conventional device, i.e., not the plate-shaped configuration (the thickness in the direction perpendicular to the displacement direction is small). Each of the object 18 and the fixation section 14 has the rectangular parallelepiped-shaped configuration (the thickness in the direction perpendicular to the displacement direction is large). The pair of thin plate sections 12a, 12b are provided so that the side surface of the object 18 is continuous to the side surface of the fixation section 14. Therefore, it is possible to selectively increase the rigidity of piezoelectric/electrostrictive device 10 in the Y axis direction.

That is, in the piezoelectric/electrostrictive device 10, it is possible to selectively generate only the operation of the object 18 in the plane (XZ plane). It is possible to suppress the operation of the object in the YZ plane (operation in the so-called flapping direction).

Next, explanation will be made for the respective constitutive components of the piezoelectric/electrostrictive device 10 according to this embodiment.

A variety of members may be attached as the object 18 depending on the purpose of use of the piezoelectric/electrostrictive device 10. For example, when the piezoelectric/electrostrictive device 10 is used for the mechanism for positioning a magnetic head of a hard disk drive or for suppressing the ringing, a member required to be positioned is attached thereto, including, for example, the magnetic head, a slider provided with the magnetic head, and a suspension provided with the slider.

As described above, the fixation section 14 is the portion for supporting the thin plate sections 12a, 12b. For example, in the case of the use to position the magnetic head of the hard disk drive, the entire piezoelectric/electrostrictive device 10 is fixed by supporting and securing the fixation section 14, for example, to a carriage arm attached to VCM (voice coil motor) or a fixation plate or a suspension attached to the carriage arm. As shown in FIG. 1, the terminals 28, 30 for driving the piezoelectric/electrostrictive elements 20a, 20b and other members are arranged on the fixation section 14 in some cases.

The material for constructing the fixation section 14 is not specifically limited provided that it has rigidity. However, it is possible to preferably use ceramics to which the ceramic green sheet-laminating method is applicable as described later on. Specifically, the material includes, for example, materials containing a major component of zirconia represented by fully stabilized zirconia and partially stabilized zirconia, alumina, magnesia, silicon nitride, aluminum nitride, and titanium oxide, as well as materials containing a major component of a mixture of them. However, in view of the high mechanical strength and the high toughness, it is preferable to use a material containing a major component of zirconia, especially fully stabilized zirconia and a material containing a major component of partially stabilized zirconia.

As described above, the thin plate section 12a, 12b is the portion which is By driven in accordance with the displacement of the piezoelectric/electrostrictive element 20a, 20b. The thin plate section 12a, 12b is the thin plate-shaped member having flexibility, and it functions to amplify the expansion and contracting displacement of the piezoelectric/electrostrictive element 20a, 20b arranged on the surface as the bending displacement and transmit the displacement to the object 18. Therefore, it is enough that the shape or the material of the thin plate section 12a, 12b provides the flexibility with the mechanical strength of such a degree that it is not broken by bending displacement. It is possible to make appropriate selection considering the response performance and the operability of the object 18.

The thin plate section 12a, 12b is composed of a metal material. It is preferable to use a metal material which has flexibility and which is capable of bending displacement as described above. However, preferably, it is desirable that the thin plate section 12a, 12b is made of an iron-based material such as various stainless steel materials and various spring steel materials. Alternatively, it is desirable that the thin plate section 12a, 12b is made of a non-ferrous material such as beryllium copper, phosphor bronze, nickel, and nickel-iron alloy. A metal material, which is equivalent to the metal material for the thin plate section 12a, 12b, can be utilized as a material for constructing the fixation section 14.

The piezoelectric/electrostrictive element 20a, 20b has at least the piezoelectric/electrostrictive layer 22 and the pair of electrodes 24, 26 for applying the electric field to the piezoelectric/electrostrictive layer 22. It is possible to use, for example, piezoelectric/electrostrictive elements 20a, 20b of the unimorph type and the bimorph type. However, those of the unimorph type combined with the thin plate section 12a, 12b are suitable for the piezoelectric/electrostrictive device 10 as described above, because they are excellent in stability of the generated displacement amount, and they are advantageous to realize the light weight.

As shown in FIG. 1, the piezoelectric/electrostrictive element 20a, 20b is preferably formed on the side surface of the thin plate section 12a, 12b in view of the fact that the thin plate section 12a, 12b can be driven to a greater extent.

Piezoelectric ceramics is preferably used for the piezoelectric/electrostrictive layer 22. However, it is also possible to use electrostrictive ceramics, ferroelectric ceramics, or anti-ferroelectric ceramics. However, when the piezoelectric/electrostrictive device 10 is used, for example, to position the magnetic head of the hard disk drive, it is important to provide the linearity concerning the displacement amount of the object 18 and the driving voltage or the output voltage. Therefore, it is preferable to use a material having small strain hysteresis. It is preferable to use a material having a coercive electric field of not more than 10 kV/mm.

Specified materials include ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate singly or in mixture.

It is also preferable to use ceramics obtained by adding, to the material described above, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum singly or in mixture.

For example, when lanthanum and/or strontium is contained in the major components of lead zirconate, lead titanate, and lead magnesium niobate, an advantage is obtained in some cases, for example, in such a way that the coercive electric field and the piezoelectric characteristic can be adjusted.

It is desirable to avoid the addition of a material such as silica which tends to form glass, because of the following reason. That is, the material such as silica tends to react with the piezoelectric/electrostrictive material during the heat treatment for the piezoelectric/electrostrictive layer 22. As a result, the composition is varied, and the piezoelectric characteristic is deteriorated.

On the other hand, it is preferable that the pair of electrodes 24, 26 of the piezoelectric/electrostrictive element 20a, 20b are made of metal which is solid at room temperature and which is excellent in conductivity. For example, it is possible to use metal simple substance or alloy of, for example, aluminum, titanium, chromium, iron, cobalt, nickel, copper, zinc, niobium, molybdenum, ruthenium, palladium, rhodium, silver, stannum, tantalum, tungsten, iridium, platinum, gold, and lead. It is also preferable to use a cermet material obtained by dispersing, in the metal described above, the same material as that of the piezoelectric/electrostrictive layer 22 or the thin plate section 12a, 12b or another ceramic material.

The material for the electrodes 24, 26 of the piezoelectric/electrostrictive element 20a, 20b is selected and determined as follows, in view of the fact that the piezoelectric/electrostrictive layer 22 and the electrodes 24, 26 (electrode films) are preferably stacked in multiple layers to be integrated into one unit, followed by being collectively sintered, because the piezoelectric/electrostrictive element 20a, 20b is stuck to the thin plate section 12a, 12b by using the adhesive 104. In this process, a high melting point metal such as platinum, palladium, and an alloy thereof is used for the electrode 24, 26. It is preferable that the electrode 24, 26 is made of cermet which is a mixture of a high melting point metal and a piezoelectric/electrostrictive material or another ceramic material.

The thickness of the electrode 24, 26 also serves as a factor to considerably decrease the displacement of the piezoelectric/electrostrictive element 20a, 20b. Therefore, it is preferable, especially for the electrode to be formed after the sintering of the piezoelectric/electrostrictive layer 22, to use organic metal paste capable of obtaining a dense and thinner film after the sintering, for example, a material such as gold resinate paste, platinum resinate paste, and silver resinate paste.

Further, for example, organic resin, brazing material, or solder may be used as the adhesive 100 for securing the object 18 to the object attachment surfaces 34a, 34b of the thin plate sections 12a, 12b and as the adhesive 102 for securing the fixation section 14 to the object attachment surfaces 34c, 34d of the thin plate sections 12a, 12b. However, it is desirable to use organic resin when the bonding is performed at a low temperature. When the bonding may be performed at a high temperature, it is preferable to use, for example, brazing material, solder, and glass.

In the piezoelectric/electrostrictive device 10 according to the embodiment described above, it is desirable that the object 18 is an objective article which is to be controlled by an actuator concerning, for example, the positional control and the prevention of vibration.

Figure 7:
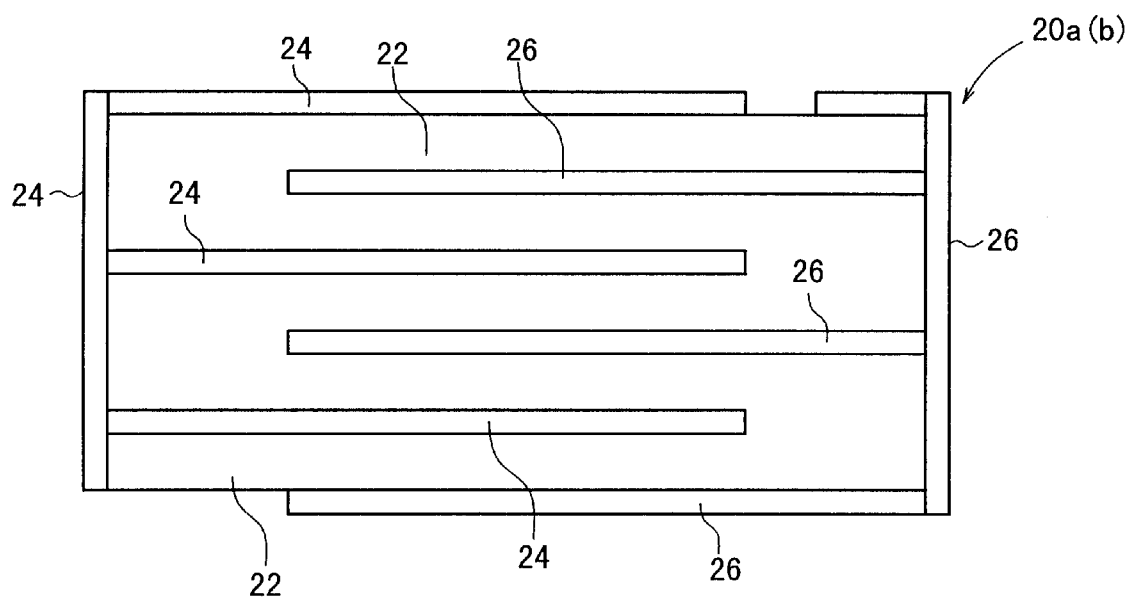
FIG. 7 shows a magnified view illustrating another exemplary arrangement of the piezoelectric/electrostrictive element.

The piezoelectric/electrostrictive element 20a, 20b described above is illustrative of the case in which the piezoelectric/electrostrictive layer 22 has the three-layered structure. Alternatively, it is also preferable that the piezoelectric/electrostrictive layer 22 has a structure in which four or more layers are stacked. FIG. 7 shows an example in which the piezoelectric/electrostrictive layer 22 has a five-layered structure. In this structure, the first electrode 24 is formed to have a comb-shaped configuration to be located at the upper surface of the first layer, the upper surface of the third layer, and the upper surface of the fifth layer. The second electrode 26 is formed to have a comb-shaped configuration to be located at the lower surface of the first layer, the upper surface of the second layer, and the upper surface of the fourth layer. The respective first electrodes 24 are common on the first side surface of the piezoelectric/electrostrictive layer 22, and the respective second electrodes 26 are common on the second side surface of the piezoelectric/electrostrictive layer 22.

In the case of the example shown in FIG. 7, the increase in the number of terminals can be suppressed by mutually connecting the first electrodes 24 and the second electrodes 26 respectively to be common. Therefore, the increase in size, which would be otherwise caused by the use of the piezoelectric/electrostrictive element 20a, 20b, can be suppressed.

Figure 8:
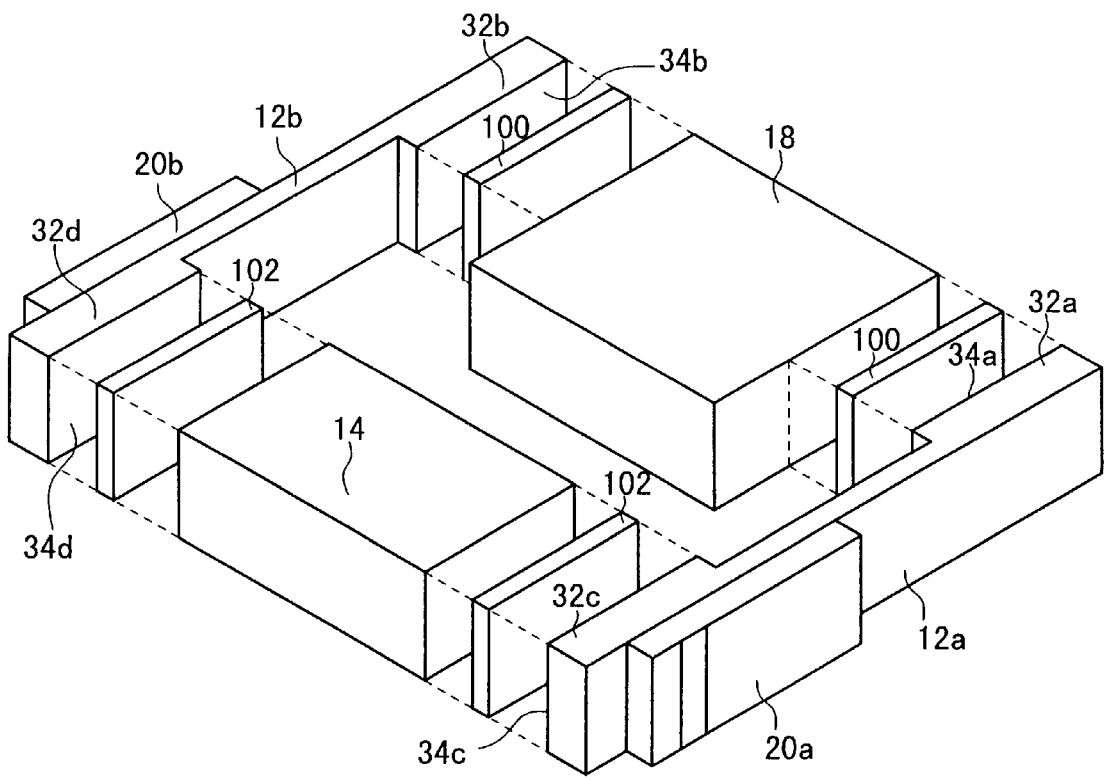
FIG. 8 illustrates an example in which thick-walled sections are provided at portions of respective thin plate sections to which an object and a fixation section are bonded respectively.

As shown in FIG. 8, in the embodiment of the present invention, the object 18 is bonded between the forward end portions of the respective thin plate sections 12a, 12b with the adhesive 100 intervening therebetween, and the fixation section 14 is bonded between the rearward end portions of the respective thin plate sections 12a, 12b with the adhesive 102 intervening therebetween.

In this arrangement, when an adhesive having fluidity is used as each of the adhesives 100, 102, the thick-walled sections 32a, 32b, 33c, 32d, which are disposed at the forward end portions and the rearward end portions of the respective thin plate sections 12a, 12b, successfully define the places for forming the adhesives 100, 102 respectively. Thus, the object 18 and the fixation section 14 can be reliably secured to the forward end portions and the rearward end portions of the thin plate sections 12a, 12b respectively. Of course, when an adhesive having high viscosity is used, it is unnecessary to provide any thick-walled sections 32a to 32d as described above.

Each of the thick-walled sections 32a to 32d may be formed such that a plate-shaped member, which is composed of the same material as that of the thin plate section 12a, 12b or which is composed of a material different from that of the thin plate section 12a, 12b, is stacked on the thin plate section 12a, 12b.

Figure 9:
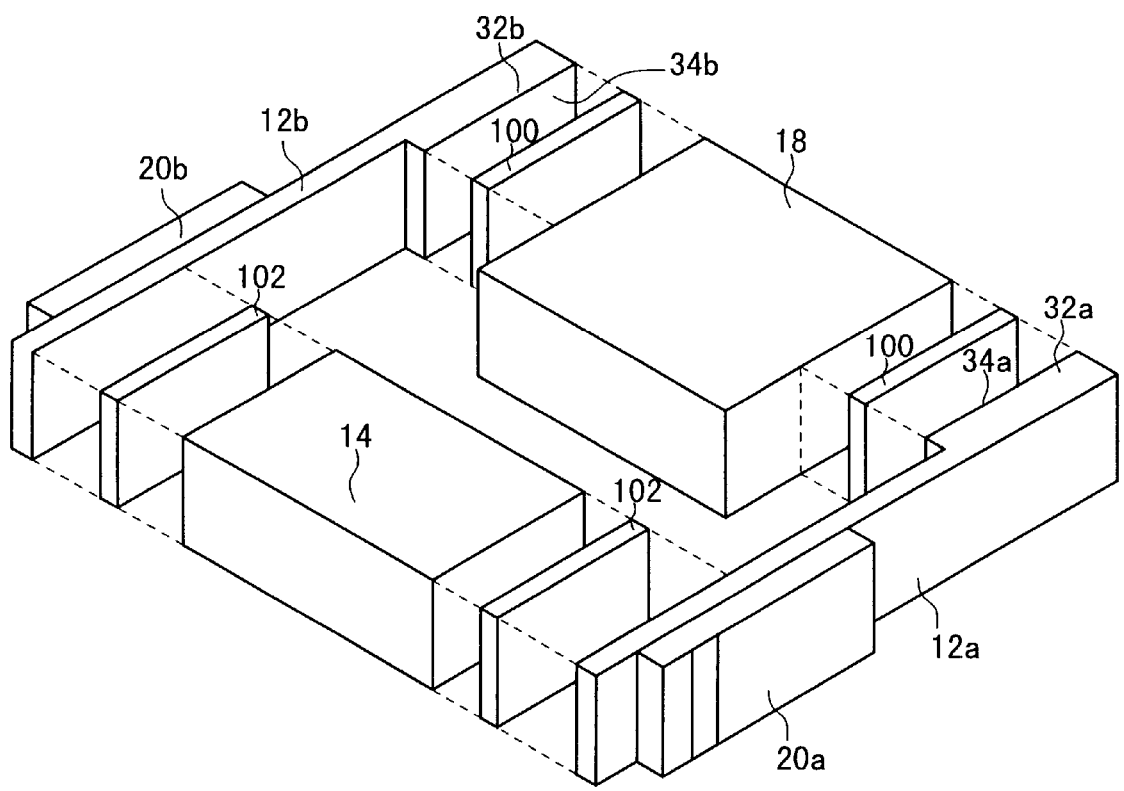
FIG. 9 illustrates an example in which thick-walled sections are provided at portions of respective thin plate sections to which an object is bonded.

FIG. 9 shows the following arrangement. That is, an adhesive having high fluidity is used as the adhesive 100 to be used to bond the object 18 and the object attachment surfaces 34a, 34b of the respective thin plate sections 12a, 12b, and an adhesive having high viscosity is used as the adhesive 102 to be used to bond the fixation section 14 and the object attachment surfaces 34c, 34d of the respective thin plate sections 12a, 12b. FIG. 9 illustrates an example in which the thick-walled sections 32a, 32b are formed at the forward end portions of the thin plate sections 12a, 12b for which the adhesive having high fluidity is used.

Figure 10:
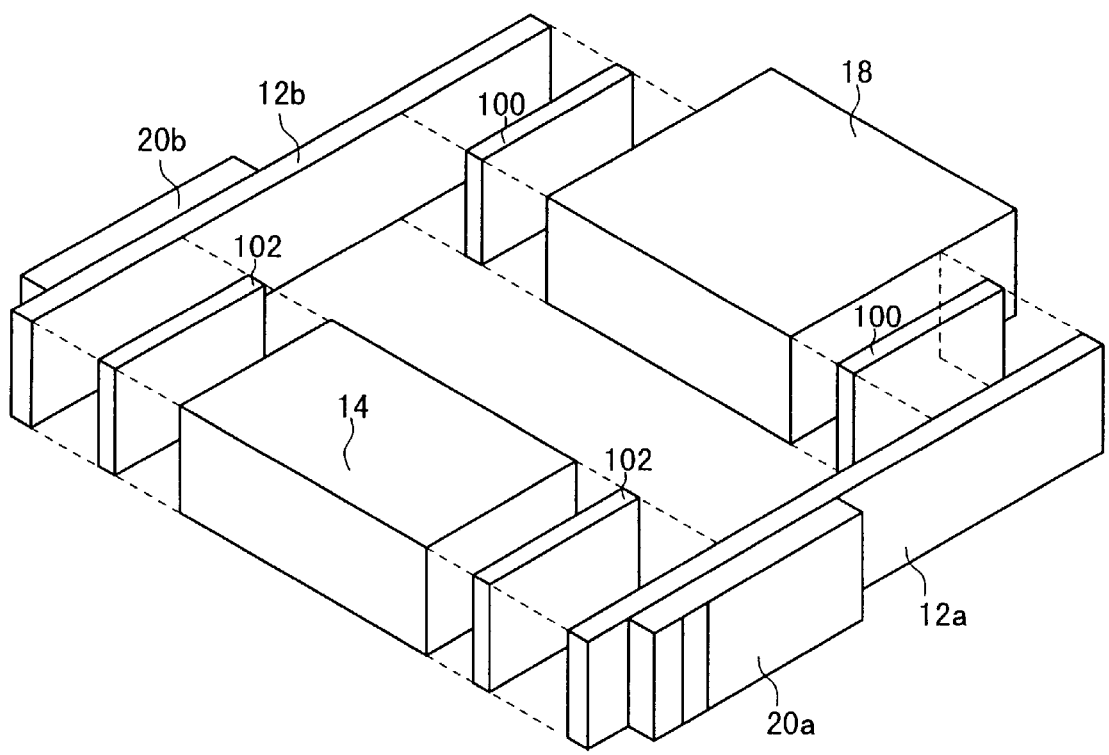
FIG. 10 illustrates an example in which no thick-walled section is provided for respective thin plate sections.

FIG. 10 shows the following arrangement. That is, an adhesive having high viscosity is used as both of the adhesives 100, 102 to be used to bond the object 18 and the thin plate sections 12a, 12b, and to be used to bond the fixation section 14 and the thin plate sections 12a, 12b. FIG. 10 illustrates a structure in which the thick-walled sections 32a to 32d as described above are not formed at the forward end portions and at the rearward end portions of the thin plate sections 12a, 12b.

Figure 11:
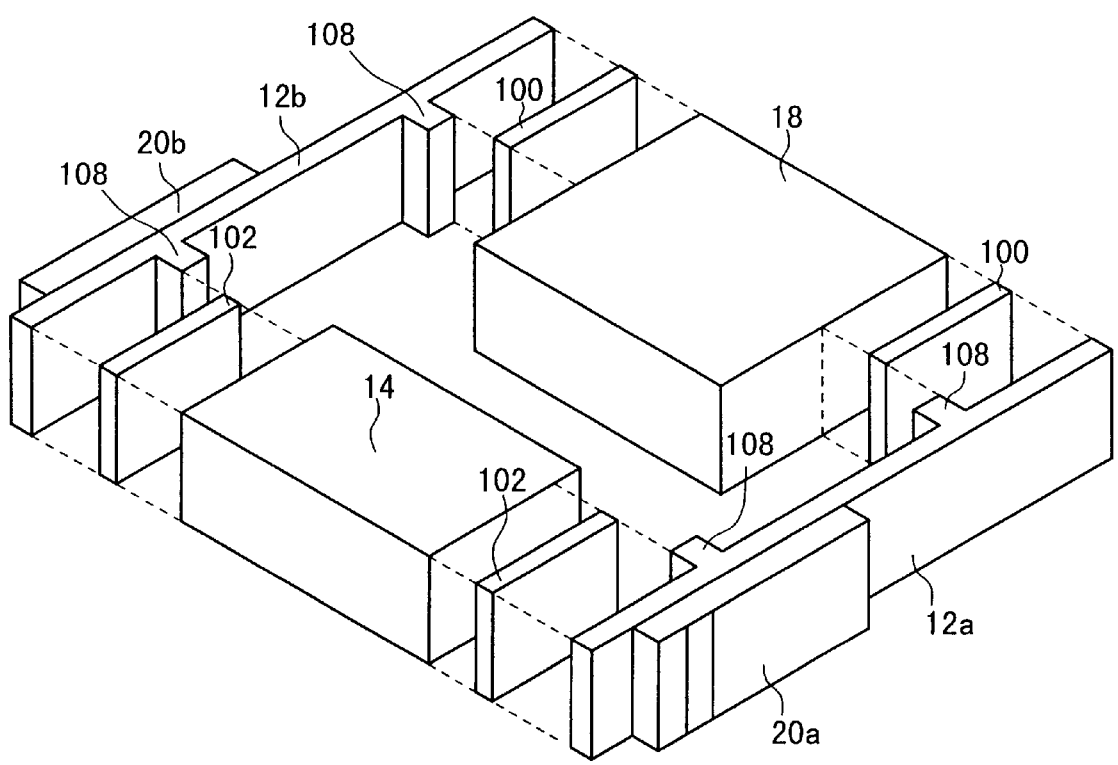
FIG. 11 illustrates an example in which projections for forming compartments for the purpose of adhesion are provided at portions of respective thin plate sections to which an object and a fixation section are bonded respectively.
Figure 12:
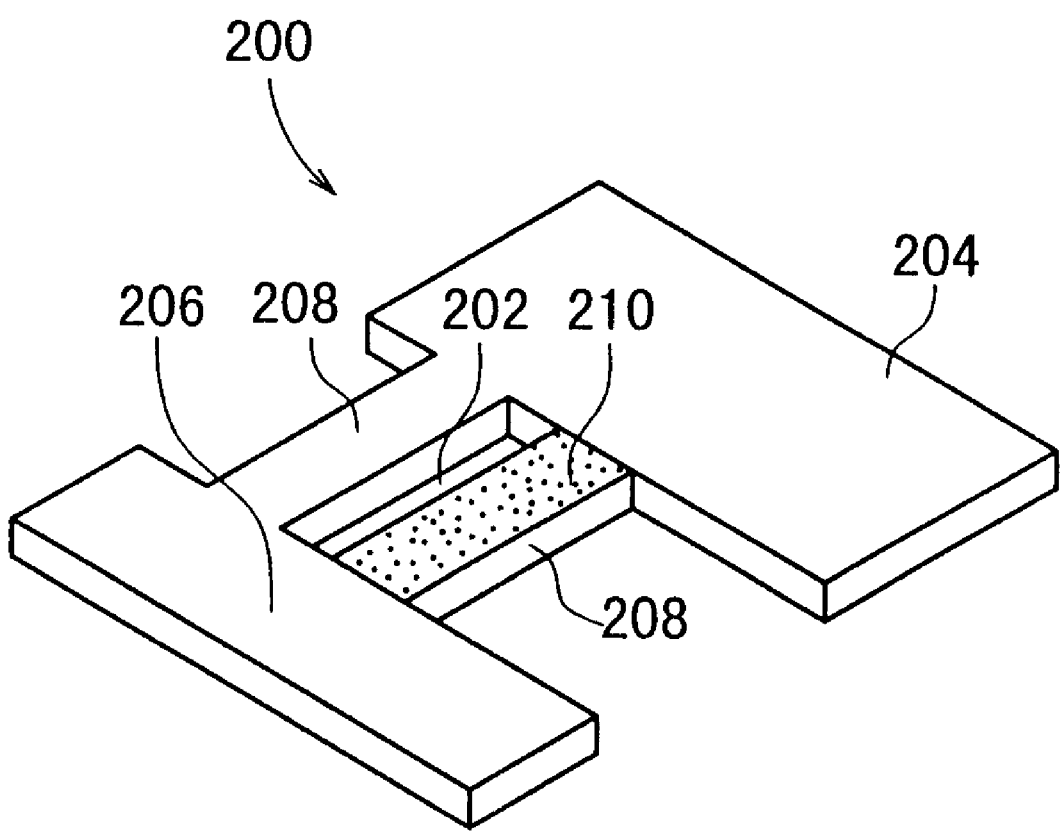
FIG. 12 shows an arrangement of a piezoelectric/electrostrictive device concerning an illustrative conventional technique.

FIG. 11 shows the following arrangement. That is, an adhesive having high fluidity is used as both of the adhesives 100, 102 to be used to bond the object 18 and the thin plate sections 12a, 12b, and to be used to bond the fixation section 14 and the thin plate sections 12a, 12b. Especially, FIG. 11 illustrates an example in which projections 108 for comparting regions to form the adhesives 100, 102 are provided for the respective thin plate sections 12a, 12b.

It is a matter of course that the piezoelectric/electrostrictive device according to this invention is not limited to the embodiments described above, which may be embodied in other various forms without deviating from the gist or essential characteristics of this invention.

What is claimed is:

1. A piezoelectric/electrostrictive device comprising:

a pair of mutually opposing thin plate sections made of metal and a fixation section for supporting said thin plate sections;

an object attached to forward end portions of said pair of thin plate sections; and one or more unimorph piezoelectric/electrostrictive elements arranged on at least one thin plate section of said pair of thin plate sections, said at least one thin plate section defining a substrate for each respective unimorph piezoelectric/electrostrictive element, wherein each of said piezoelectric/electrostrictive elements includes a piezoelectric/electrostrictive operating portion defined between opposed electrodes, and the piezoelectric/electrostrictive operating portion extends from an outer surface of the fixation section onto at least a portion of the thin plate sections, wherein:

an areal size of a surface of said object opposed to said thin plate section is larger than an areal size of an object attachment surface of said thin plate section.

2. The piezoelectric/electrostrictive device according to claim 1, wherein a first adhesive intervenes between said piezoelectric/electrostrictive element and said thin plate section.

3. The piezoelectric/electrostrictive device according to claim 1, wherein said object is secured to said object attachment surface of said thin plate section by the aid of a second adhesive.

4. The piezoelectric/electrostrictive device according to claim 3, wherein said first adhesive and/or said second adhesive is composed or organic resin.

5. The piezoelectric/electrostrictive device according to claim 3, wherein said first adhesive and/or said second adhesive is composed of glass, brazing material, or solder.

6. The piezoelectric/electrostrictive device according to claim 1, wherein said object is attached to only forward end portions of said pair of thin plate sections.

* * * * *

UNITED STATES PATENT AND TRADEMARK OFFICE
CERTIFICATE OF CORRECTION

PATENT NO.    : 6,657,364 B1
DATED         : December 2, 2003
INVENTOR(S)   : Yukihisa Takeuchi and Kazuyoshi Shibata It is certified that error appears in the above-identified patent and that said Letters Patent is hereby corrected as shown below:

<u>Title page,</u>
Item [56], References Cited, U.S. PATENT DOCUMENTS, please add
-- 4,742,264   5/1988   Ogawa --

Signed and Sealed this

Twenty-fourth Day of August, 2004

JON W. DUDAS
*Director of the United States Patent and Trademark Office*